(12) United States Patent
Duan et al.

(10) Patent No.: US 9,106,046 B2
(45) Date of Patent: Aug. 11, 2015

(54) INTEGRATED OPTICAL STRUCTURE COMPRISING AN OPTICAL ISOLATOR

(71) Applicant: Alcatel-Lucent, Paris (FR)

(72) Inventors: Guang-Hua Duan, Palaiseau (FR); Francois Brillouet, Marcoussis (FR); Jean-Louis Gentner, Marcoussis (FR)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 14/349,394

(22) PCT Filed: Oct. 17, 2012

(86) PCT No.: PCT/EP2012/070563
§ 371 (c)(1),
(2) Date: Apr. 3, 2014

(87) PCT Pub. No.: WO2013/057138
PCT Pub. Date: Apr. 25, 2013

(65) Prior Publication Data
US 2014/0247477 A1    Sep. 4, 2014

(30) Foreign Application Priority Data
Oct. 20, 2011  (FR) ...................... 11 59501

(51) Int. Cl.
*H01S 5/02* (2006.01)
*H01S 3/10* (2006.01)
(Continued)

(52) U.S. Cl.
CPC ............ *H01S 5/0064* (2013.01); *G02F 1/0955* (2013.01); *H01S 5/50* (2013.01);
(Continued)

(58) Field of Classification Search
CPC ... H01S 5/021; H01S 5/5036; H01S 3/10007; G02B 2006/12157; G02B 2006/12085
See application file for complete search history.

(56) References Cited

U.S. PATENT DOCUMENTS 3,928,870 A * 12/1975 Ahrenkiel et al. .............. 360/59
6,208,795 B1    3/2001 Nakano et al.
(Continued)

FOREIGN PATENT DOCUMENTS

EP    1039330 A2    9/2000
JP    S628561 A    1/1987
(Continued)

OTHER PUBLICATIONS

Espindola et al., "Magneto-optical nonreciprocal phase shift in garnet_silicon-on-insulator waveguides", Optics Letters, vol. 29 No. 9, pp. 941-943 (2004).*

(Continued)

*Primary Examiner* — Eric Bolda
(74) *Attorney, Agent, or Firm* — Harness, Dickey and Pierce, P.L.C.

(57) ABSTRACT

An integrated optical structure includes at least one optical isolator, having a magneto-optical layer, associated with at least one SOA optical amplifier having a waveguide having an n-doped semiconductor layer, a p-doped semiconductor layer, and an active area disposed between the n-doped semiconductor layer and the p-doped semiconductor layer. The optical isolator is disposed between an SOI base and the SOA optical amplifier's waveguide. The optical isolator's magneto-optical layer is disposed between a lower insulating layer and an upper insulating layer. The optical isolator's magneto-optical layer may be a layer of ferromagnetic metallic material, such as a Fe—Co metallic alloy, or a magnetic oxide layer. An optical device includes at least one integrated optical structure.

12 Claims, 3 Drawing Sheets

Figure 1:
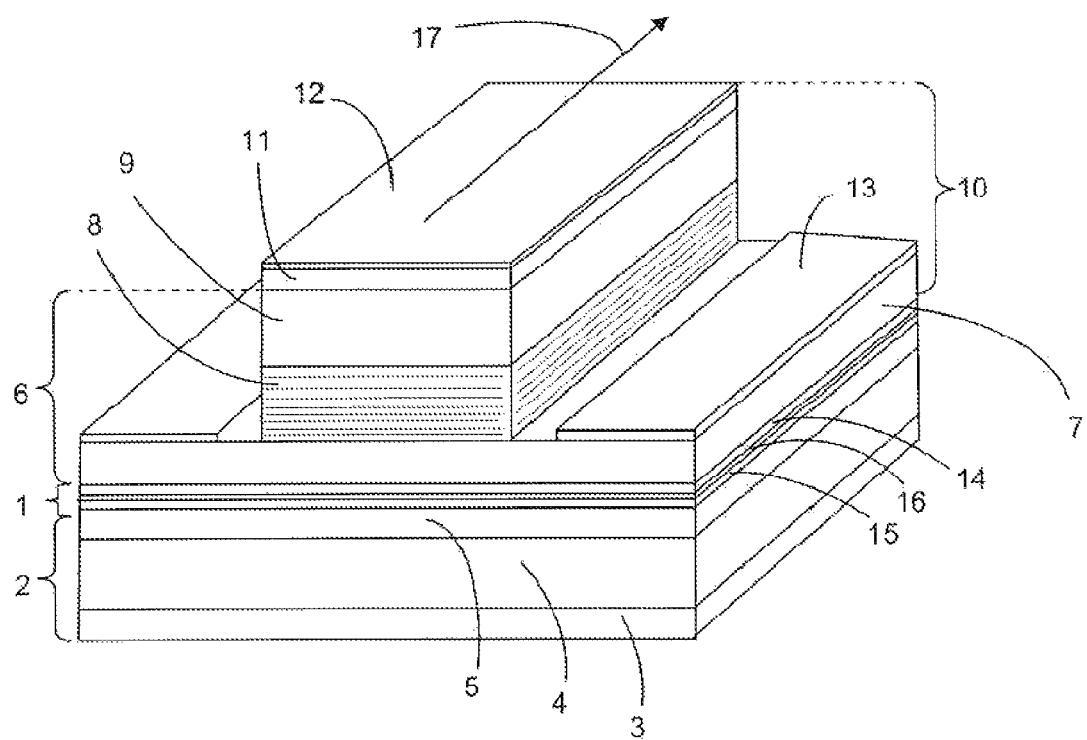

(51) Int. Cl.
*H01S 5/00* (2006.01)
*G02F 1/095* (2006.01)
*H01S 5/50* (2006.01)
*G02B 6/12* (2006.01)
*H01S 5/026* (2006.01)
*H01S 5/022* (2006.01)
*H01S 5/10* (2006.01)
*B82Y 20/00* (2011.01)

(52) U.S. Cl.
CPC ...... *B82Y 20/00* (2013.01); *G02B 2006/12085* (2013.01); *G02B 2006/12157* (2013.01); *H01S 5/021* (2013.01); *H01S 5/026* (2013.01); *H01S 5/02248* (2013.01); *H01S 5/1014* (2013.01); *Y10S 977/755* (2013.01)

(56) References Cited

U.S. PATENT DOCUMENTS 7,567,604 B2 * 7/2009 Accard et al. ............... 372/46.01
2004/0223719 A1 * 11/2004 Ram et al. .................... 385/144

FOREIGN PATENT DOCUMENTS

JP 2000266947 A 9/2000
JP 2004-240003 A 8/2004
JP 2010123688 A 6/2010

OTHER PUBLICATIONS

International Search Report for PCT/EP2012/070563 dated Nov. 11, 2012.

Shimizu, Hiromasa et al. "InGaAsP/InP evanescent mode waveguide optical isolators and their application to InGaAsP/InP/Si hybrid evanescent optical isolators" Optical and Quantum Electronics, Kluwer Academic Publishers, vol. 41, No. 9, Mar. 7, 2010.

Shimizu, Hiromasa et al. "Evanescent Semiconductor Active Optical Isolators for Low Insertion Loss and High Gain Saturation Power", Journal of Lightwave Technology, IEEE Service Center, New York, NY. vol. 27, No. 9, May 1, 2010.

Shimizu, H. et al. "Design of semiconductor-waveguide-type optical isolators using the nonreciprocal loss/gain in the magneto-optical waveguides having MnAs nanoclusters" Applied Physics Letters, AIP, American Institute of Physics, Melville, NY vol. 81, No. 27, Dec. 30, 2002.

* cited by examiner (a)

(b)

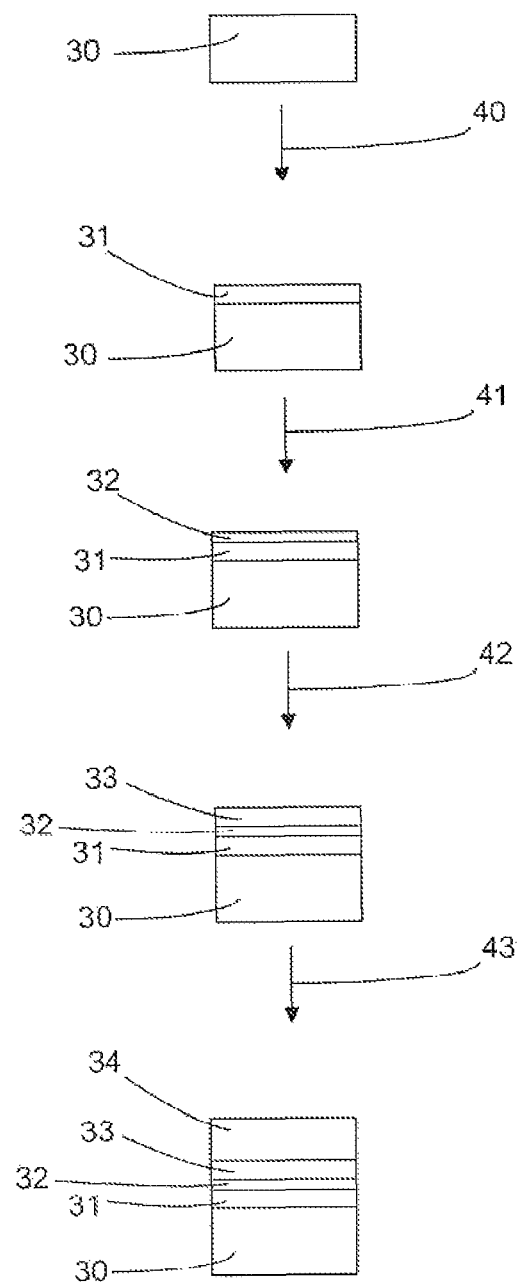

INTEGRATED OPTICAL STRUCTURE COMPRISING AN OPTICAL ISOLATOR

This application is a national phase under 35 U.S.C. §371 of PCT International Application No. PCT/EP2012/070563 which has an International filing date of Oct. 17, 2012, which claims priority to French patent application number FR1159501 filed Oct. 20, 2011; the entire contents of each of which are hereby incorporated by reference.

CROSS-REFERENCE

This application is based on French Patent Application No. 11,59,501 filed on Oct. 20, 2011, the disclosure of which is hereby incorporated by reference thereto in its entirety, and the priority of which is hereby claimed under 35 U.S.C. §119.

BACKGROUND

The present invention pertains to an optical isolator intended to be integrated into optical devices, such as optoelectronic components, and, in particular, photonic integrated circuits, or PICs. These optical devices are used mainly in the field of high-speed digital telecommunications. The invention also extends to the method for manufacturing such an optical isolator.

An optical isolator is a nonreciprocal passive device that has high attenuation in one direction and low attenuation in the opposite direction; it makes it possible to transmit light in only one direction, but prevents light from propagating in an opposite direction. For this reason, optical isolators are essential elements for eliminating the negative effects of reflected and parasitic light beams in fiber-optic transmission, particularly at high speeds.

Today, commercial products do not contain any optical isolators integrated into their chips. Manufacturers of optoelectronic components, particularly photonic integrated circuits, or PICs, await a solution. In the remainder of the text, the term "integrated component" refers to a component that is monolithically incorporated into a device, meaning a component supported by a substrate that is shared with the device's components.

Two types of optical isolators have been studied. A first type of optical isolator implements a nonreciprocal optical effect so that it can serve as an optical isolator, the most well-known of which is the Faraday effect. When subjected to an outside magnetic field, some materials, known as magneto-optical materials, change the light's polarization direction. An optical isolator of this first type is normally composed of (i) a magnetic garnet crystal that has a Faraday effect, (ii) a permanent magnet for applying a defined magnetic field, and (iii) polarizing elements that allow only light that has a given direction of polarization (incident light) to pass through, while blocking the passage of light that has a direction of polarization orthogonal to that of the incident light. This first type of optical isolator is hard to integrate into optical devices, as it requires multiple components whose integrated version is not yet available.

There is a second type of optical isolator, an absorption optical isolator, whose complex optical index is nonreciprocal. In the presence of a magnetic field, the optical index of some ferromagnetic materials, such as an iron-cobalt metal alloy, depends on the direction in which the light propagates. Depending on its direction of propagation, the light will consequently be more attenuated or less. This second type of optical isolator is well suited to being integrated into optical devices that particularly comprise a semiconductor laser source.

In this second sort of optical isolator, the ferromagnetic metals introduce high optical power losses, often greater than 20 dB, including in the incident direction. Semiconductor optical amplifiers, or SOAs, must therefore also be integrated in order to compensate for these optical power losses. Thus, the amplification of the optical signal provided by the SOA makes it possible to offset the ferromagnetic material's optical power losses in a first direction of incident light propagation. In the direction opposite the propagation, the ferromagnetic material's attenuation remains predominant, in order to keep the light from traveling backwards.

And optical isolator of this second type normally comprises an optical amplifier SOA made up of a stack (i) of an n-doped semiconductor material layer, (ii) an amplifying active part, which has an optical index greater than the layers that surround it, and (iii) a p-doped semiconductor material layer. In order to integrate the optical isolator, the ferromagnetic metals may be deposited onto the top or sides of the SOA's waveguide.

In the event that ferromagnetic metals are deposited onto the top of the SOA's waveguide, the strip's height is very critical, as the optical signal's propagation mode needs to interact with the ferromagnetic metals. This is because the waveguide's thickness determines the distance separating the ferromagnetic metals from the amplifying active layer. In this case, there will be considerable optical power losses due both to the electrical contact layers, often made of an InGaAs, ternary semiconducting material, and to the electrical contact-conveying metallic layer, which is placed above the waveguide.

If the ferromagnetic metals are deposited on the sides of a SOA's waveguide, the ferromagnetic metal layer depositing operation, generally carried out in steps of depositing following by steps of etching, is the very critical operation. The step of removing material by etching turns out to be very difficult to carry out in this type of optical isolator.

SUMMARY

The purpose of the present invention is to disclose an integrated optical structure comprising an optical isolator of the second type that does not exhibit the drawbacks of optical isolators of this type known from the prior art.

It is a further purpose of the invention to disclose an integrated optical structure comprising an optical isolator whose performance is improved, particularly by a reduction in optical power losses, which contributes to a decrease in the SOA optical amplifier's power consumption.

It is a further purpose of the invention to disclose an integrated optical structure comprising an optical isolator that is easier and less expensive to manufacture.

The object of the present invention is an integrated optical structure comprising
  at least one SOA optical amplifier comprising a waveguide comprising an n-doped semiconductor layer, a p-doped semiconductor layer, and an active zone disposed between the n-doped semiconductor layer and the p-doped semiconductor layer, associated with
  at least one optical isolator disposed between an SOI base and the SOA optical amplifier waveguide, comprising a magneto-optical layer disposed between a lower insulating layer and an upper insulating layer.

The optical isolator's integrated optical structure uses the hybrid technology of integrating III-V semiconducting materials on a silicon-based substrate, called "III-V on SOI" (for "Silicon On Isolator"). In the present situation, instead of having a magneto-optical layer on top or on the side of the III-V semiconductor waveguide as in the prior art, the magneto-optical layer is now disposed beneath the waveguide's active zone.

According to one embodiment, the optical isolator's magneto-optical layer is a layer of ferromagnetic metallic material. Ferromagnetic materials include iron, cobalt, nickel, Fe-based alloys (particularly ferrites) and/or Co, and HEUSLER alloys with the formula $X_2YZ$, such as $Cu_2MnAl$, $Cu_2MnIn$, $Cu_2MnSn$, etc . . . Preferably, the optical isolator's magneto-optical layer is a metallic alloy layer with the equiatomic composition $Fe_{50}Co_{50}$.

According to another embodiment, the optical isolator's magneto-optical layer is a magnetic oxide layer (garnets, perovskite, etc.).

According to a first aspect, the upper insulating layer and the lower insulating layer are made up of an insulating material chosen from between a silicon nitride SiN and a silicon oxide $SiO_x$.

According to a second aspect, the n-doped semiconductor layer and p-doped semiconductor layer of the waveguide are made of a semiconducting material of the III-V group, particularly indium phosphide InP or gallium arsenide GaAs.

According to a third aspect, the active area of the waveguide comprises a structure with multiple quantum wells.

It is a further object of the invention to have an optical device comprising at least one integrated optical structure as described above, comprising at least one optical isolator and at least one SOA optical amplifier.

It is a further object of the invention to have a method for creating the previously described integrated optical structure. The method comprises the following steps:
  a first layer of an insulating material is deposited onto an SOI base,
  a magneto-optical layer is deposited onto the first layer of insulating material,
  a second layer of an insulating material is deposited onto the magneto-optical layer,
  a semiconducting die is affixed to the second layer of insulating material,
  the semiconducting die is treated in order to create an optical waveguide.

Preferably, the magneto-optical layer is deposited by a cathodic spraying method.

Advantageously, the magneto-optical layer is etched in order to give it a structure that makes it possible to increase the magneto-optical effect.

According to one variant, the method comprises at least one operation intended to smooth the surface of a layer of insulating material using a CMP method.

The present invention has several advantages, including:
  injecting an electrical current into the amplifying active area is now separated from the magneto-optical layer, which allows it to be optimized independent of the optimization of the magneto-optical layer;
  the technology for producing the optical device is based on III-V on SOI hybrid integration, so the manufacturing of the isolator is much easier than in the prior art, and the optical isolator may thereby be used on silicon PIC photonic integrated circuits.

The invention is intended to be used by optoelectronic component manufacturers, particularly PIC photonic integrated circuits.

BRIEF DESCRIPTION

Figure 2:
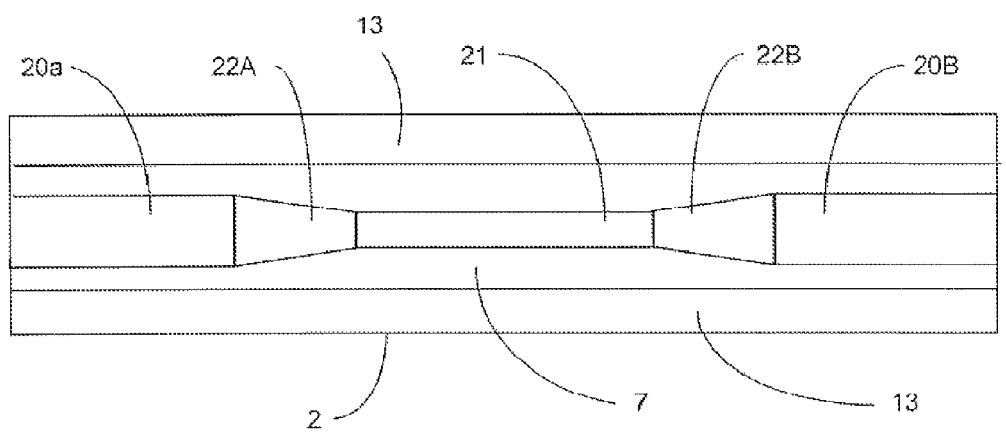
Figure 2:
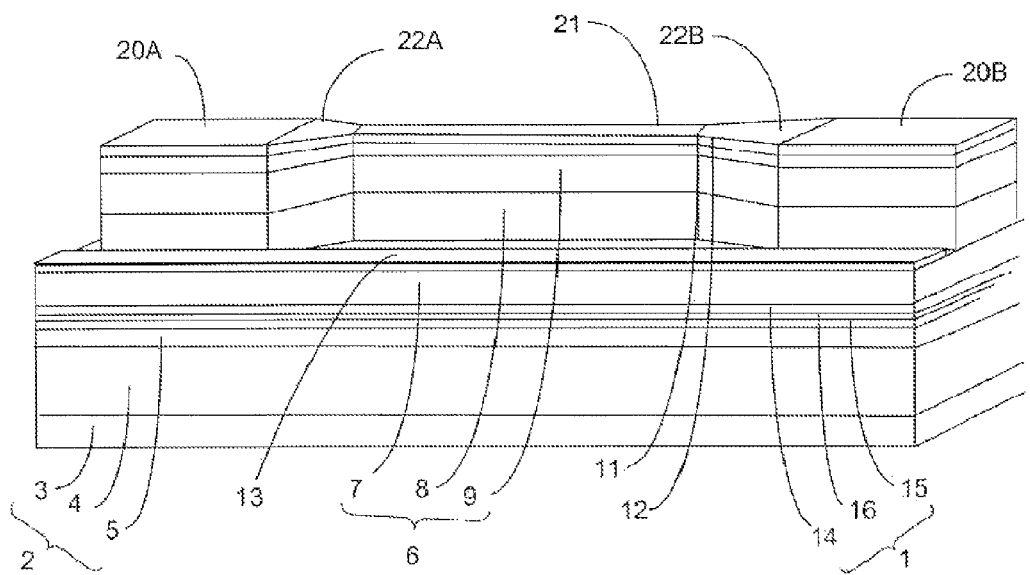

Other characteristics and advantages of the present invention will become apparent upon reading the following description of one embodiment, which is naturally given by way of a non-limiting example, and in the attached drawing, in which:

FIG. 1 depicts a lateral perspective view of one embodiment of an integrated optical structure comprising an optical isolator, FIGS. 2a and 2b depict a view, respectively from the top and side, of another embodiment of an integrated optical structure comprising an optical isolator, FIG. 3 schematically depicts the method of creating an integrated optical structure comprising an optical isolator.

Naturally, as these figures serve only to illustrate the invention, the dimensions of the various elements depicted are not necessarily to scale.

DETAILED DESCRIPTION

FIG. 1 depicts an integrated optical structure comprising an optical isolator created by the hybrid technology III-V on SOI. The SOI technology consists of inserting an electrically insulating layer of a silicon oxide $SiO_x$, such as $SiO_2$, between a semiconducting thin upper layer of silicon Si and a semiconducting thick lower layer of silicon Si, with the assembly constituting a SOI base.

The optical isolator 1 is integrated onto a SOI base 2 that comprises a crystalline silicon Si layer 3, or any other semiconducting substrate, covered by an insulating layer 4, for example one made of a silicon oxide $SiO_x$ like silica $SiO_2$, topped with a second crystalline silicon Si layer 5. Typically, the thickness of the silicon layers is at most 0.5 μm and that of the silicon oxide layer is about 2 μm.

The optical isolator 1 is associated with an optical waveguide 6 made of a stack of a semiconducting lower n-doped III-V layer 7, for example an indium phosphide InP based one, an active area 8, and a semiconducting upper p-doped III-V layer 9, for example also an indium phosphide InP based one. The semiconducting material III-V may particularly be an indium phosphide InP or a gallium arsenide GaAs. The active area 8 comprises, for example, an MQW ("Multiple Quantum Wells") structure.

The SOA 10 comprises the waveguide 6 with a semiconducting multilayer structure, topped with an upper electrical contact layer 11, for example made of an InGaAs ternary semiconducting material. The upper electrical contact layer 11 is itself coated with a metallic film 12 that makes it possible to inject current through the metallic contact into the active layer of the SOA amplifying semiconducting structure. In this case, the lower semiconducting layer 7 plays the role of a lower electrical contact layer for the SOA optical amplifier 10. A metallic layer 13 may then be affixed onto the lower semiconducting layer 7 to allow the current to continue. The optical losses may thereby be compensated by injecting electrical current into a SOA semiconductor optical amplifier structure with multiple quantum wells.

The optical isolator 1 comprises an upper insulating layer 14 and a lower insulating layer 15, for example one made of a silicon nitride $Si_xN_y$ like $Si_3N_4$, or a silicon oxide $SiO_x$. Preferably, the insulating layer is made of $SiO_2$. A magneto-optical layer 16 of ferromagnetic metals is sandwiched between the upper insulating layer 14 and the lower insulating layer 15. The magneto-optical layer 16 comprises, for example, ferromagnetic metals, such as an iron-cobalt [Fe:Co] metal alloy, the atomic percentage of iron being comprised between 50% and 90%, and preferably the metal alloy is an equiatomic composition $Fe_{50}Co_{50}$. The magneto-optical layer 16 creates an attenuation of the light wave 17 propagating within the optical waveguide 6. The ferromagnetic, metallic magneto-optical layer 16 is magnetized perpendicular to the direction in which the optical signal propagates. The magneto-optical layer 16 is constructed here by a method comprising steps of depositing followed by steps of etching, so as to let the magneto-optical layer 16 made of a ferromagnetic metallic alloy [Fe:Co] occupy a determined surface. The SOA optical amplifier 10 comprising the waveguide 6 with III-V semiconductors makes it possible to obtain optical amplification, while the ferromagnetic metals 16 introduce a refraction index or non-reciprocal losses in order to serve as an optical isolator.

In this embodiment, the waveguide's width may vary from 0.5 μm to 2 μm, for example. The magneto-optical layer 16, for example a ferromagnetic metallic alloy [Fe:Co] preferably has a thickness between 30 nm and 150 nm, and the upper 14 and lower 15 insulating layers, for example made of silica $SiO_2$, placed above and in contact with the magneto-optical layer 16, have a thickness of about 30 nm.

The optical waveguide 6 based on III-V semiconductors here has a typical layered structure that allows coupling between the III-V semiconductors and the optical isolator 1 integrated onto a base 2 constructed using the SOI technique. However, in order to have sufficient coupling between TM mode (for "Transverse Magnetic", a mode for which the losses and the refraction index of ferromagnetic metals are non-reciprocal) and the metallic magneto-optical layer 16 (with more than 0.5% of the mode confinement factor in the magneto-optical layer 16), it is necessary to construct a very narrow III-V waveguide 6 (width below 2 μm) or to alter the layered vertical structure of the III-V material.

If the layered vertical structure of the III-V material is not altered, there is a waveguide structure as depicted in FIGS. 2a and 2b. Such a structure comprises two extreme regions 20A and 20B of the amplifier, in which the III-V waveguide typically has a width of 2 μm. The structure also comprises a central isolator region 21 whose width is about 0.5 μm. The structure finally comprises two intermediary regions 22A and 22B in which two cones enable the transition between the isolator and amplifier regions. In the extreme regions 20A and 20B, the optical mode propagates within the SOA optical amplifier without interacting with the optical isolator. In the central region 31, the optical mode, whose profile has been altered, partially propagates within the optical isolator.

The optical isolator's integrated optical structure may be inserted into a PIC photonic integrated circuit, for example to allow insulation between two optical devices.

The invention may also be used to construct an optical insulator integrated optical structure using a magneto-optical layer made of a magnetic oxide, such as a magneto-optical garnet (YIG, BIG, Ce:YIG, etc . . . ), rather than ferromagnetic metals. In this situation, the garnet layer is deposited or affixed onto a lower insulating layer covering a base SOI.

The method for manufacturing the integrated optical structure is schematically depicted in FIG. 3. Regardless of the nature of the magneto-optical layer, the construction of the integrated optical structure proceeds in a like manner.

It starts by creating the SOI base 30. Next, during the first step of depositing 40, a thick layer of an insulating material like silicon oxide $SiO_2$ onto an SOI base 30 so as to cover its surface. A chemical and mechanical polishing, or CMP method is then applied to the assembly to obtain a flat surface. This results in a SOI base 30 topped with the lower insulating layer 31 with a thickness of between 30 nm and 150 nm.

The magneto-optical layer 32 is then deposited onto the lower insulating layer 31, for example by a cathodic spraying method, during a second step of depositing 41. Advantageously, the magneto-optical layer 32 is etched in order to give it a structure that makes it possible to increase the magneto-optical effect. An example of such a structure is a Bragg grating, in which the magneto-optical layer is periodically etched, which causes the magneto-optical effect to increase within a wavelength range.

A third step of depositing 42 is used to deposit a second layer of an insulating material, for example silicon oxide $SiO_2$ atop the etched magneto-optical layer 32 in order to obtain the upper insulating layer 33. The surface of the new assembly is itself made flat by a CMP method.

Finally, during the fourth step 43, a III-V semiconducting die 34 is affixed onto the upper insulating layer 33 deposited atop the magneto-optical layer 32, for example, one made of ferromagnetic metal or garnet. The III-V semiconducting die 34 is treated in order to create the III-V active waveguide of the SOA optical amplifier, whose presence makes it possible to offset the optical power losses in this sort of optical isolator.

There is claimed:

1. An integrated optical structure comprising
   at least one SOA optical amplifier comprising a waveguide comprising an n-doped semiconductor layer, a p-doped semiconductor layer, and an active zone disposed between the n-doped semiconductor layer and the p-doped semiconductor layer, associated with
   at least one optical isolator disposed between a SOI base and the SOA optical amplifier's waveguide, comprising a magneto-optical layer,
   wherein the magneto-optical layer is disposed between a lower insulating layer and an upper insulating layer.

2. An integrated optical structure according to claim 1, wherein the optical isolator's magneto-optical layer is a layer of ferromagnetic metallic material.

3. An integrated optical structure according to claim 2, wherein the optical isolator's magneto-optical layer is a Fe—Co metallic alloy layer.

4. An integrated optical structure according to claim 1, wherein the optical isolator's magneto-optical layer is a layer of magnetic oxide.

5. An integrated optical structure according to claim 1, wherein the upper insulating layer and the lower insulating layer are made up of an insulating material chosen from among a silicon nitride $Si_xN_y$ and a silicon oxide $SiO_x$.

6. An integrated optical structure according to claim 1, wherein the n-doped semiconductor layer and the p-doped semiconductor layer of the waveguide are made of a group III-V semiconductor material.

7. An integrated optical structure according to claim 1, wherein the waveguide's active area comprises a multiple quantum well structure.

8. An optical device comprising at least one integrated optical structure according to claim 1, comprising at least one optical isolator and at least one SOA optical amplifier.

9. A method for constructing an integrated optical structure according to claim 1, comprising
   a first layer of an insulating material is deposited onto an SOI base,
   a magneto-optical layer is deposited onto the first layer of insulating material,
   a second layer of an insulating material is deposited onto the magneto-optical layer,
   a semiconducting die is affixed to the second layer of insulating material, the semiconducting die is treated in order to create an optical waveguide.

10. A method according to claim 9, wherein the magneto-optical layer is deposited by a cathodic spraying method.

11. A method according to one of the claim 10, wherein the magneto-optical layer is etched in order to give it a structure that makes it possible to increase the magneto-optical effect.

12. A method according to claim 10, comprising at least one operation intended to smooth the surface of a layer of insulating material using a chemical and mechanical polishing method.

* * * * *